United States Patent [19]
Linliu et al.

[11] Patent Number: 6,121,082
[45] Date of Patent: Sep. 19, 2000

[54] METHOD OF FABRICATING DRAM WITH NOVEL LANDING PAD PROCESS

[75] Inventors: Kung Linliu; Mai-Ru Kuo, both of Hsinchu, Taiwan

[73] Assignee: Worldwide Semiconductor Manufacturing Corp., Hsinchu, Taiwan

[21] Appl. No.: 09/301,482

[22] Filed: Apr. 28, 1999

[51] Int. Cl.[7] ............................................. H01L 21/8242
[52] U.S. Cl. ........................ 438/253; 438/396; 438/238
[58] Field of Search ............................ 438/238, 253–256, 438/393–399

[56] References Cited

U.S. PATENT DOCUMENTS

5,681,773  10/1997  Tseng .
5,766,993   6/1998  Tseng ...................................... 438/253

Primary Examiner—Jey Tsai

[57] ABSTRACT

A method for fabricating landing pads for DRAM cells is disclosed. The method comprises following steps: At first, a substrate formed with isolation regions, periphery transistor region and a defined DRAM region are patterned so that an oxide layer on the defined DRAM region are removed to expose the source/drain region nitride caps, and nitride spacers. After a polysilicon layer is formed on all resulting surfaces, a photoresist pattern is subsequently formed on the polysilicon layer of the DRAM region so that the photoresist openings over the nitride cap are formed. Next, a conformal polymer layer of about 0.1 μm in thickness is formed on all resulting surfaces so that a smaller polymer opening about 0.1 μm size or beyond is formed in each of the photoresist openings. Finally, using the polymer layer as a mask and the nitride cap as a stopping layer, a polymer etching and a polysilicon etching are performed so that the landing pads are generated.

18 Claims, 11 Drawing Sheets

METHOD OF FABRICATING DRAM WITH NOVEL LANDING PAD PROCESS

FIELD OF THE INVENTION

The present invention relates to a semiconductor memory process, and more specifically, to the novel process of landing pad for the dynamic random access memory (DRAM).

BACKGROUND OF THE INVENTION

The computer and the electronic industry demand of increasing its whole speed performance as well as the cost down for fabricating integrated circuits. Doubtlessly, the DRAM integrated circuits play a crucial role for a computer is concerned. A great number of DRAM memory cells are usually required, and thus they play a vital factor for determining the I/O speed of the computer. Hence, pursuing the miniaturization of the DRAM device so as to down the cost as well as high-speed performance are almost the ultimate goals.

In order to miniaturize the device, the concept of landing pad or landing plug technology is currently popular in DRAM industry so as to shrink the feature size of DRAM cell. However, the spacing between the landing pads has to be decreased so that they can provide enough areas for contact landing as the density of DRAM cells in a chip increasing to giga-bit levels. The narrower spacing will increases the fabrication difficulty due to the limitation lithography overlay. In order to achieve desired performance, the spacing need to be as small as 0.1 μm for 0.21 μm feature size 64M DRAM and beyond. The critical dimension of 0.1 μm is quite far beyond the present technology of lithography with 248 nm DUV (deep ultra-violet) stepper or scanner. Thus the oxide spacer reduced the spacing is applied for solving the lithography limitation currently.

Figure 1:
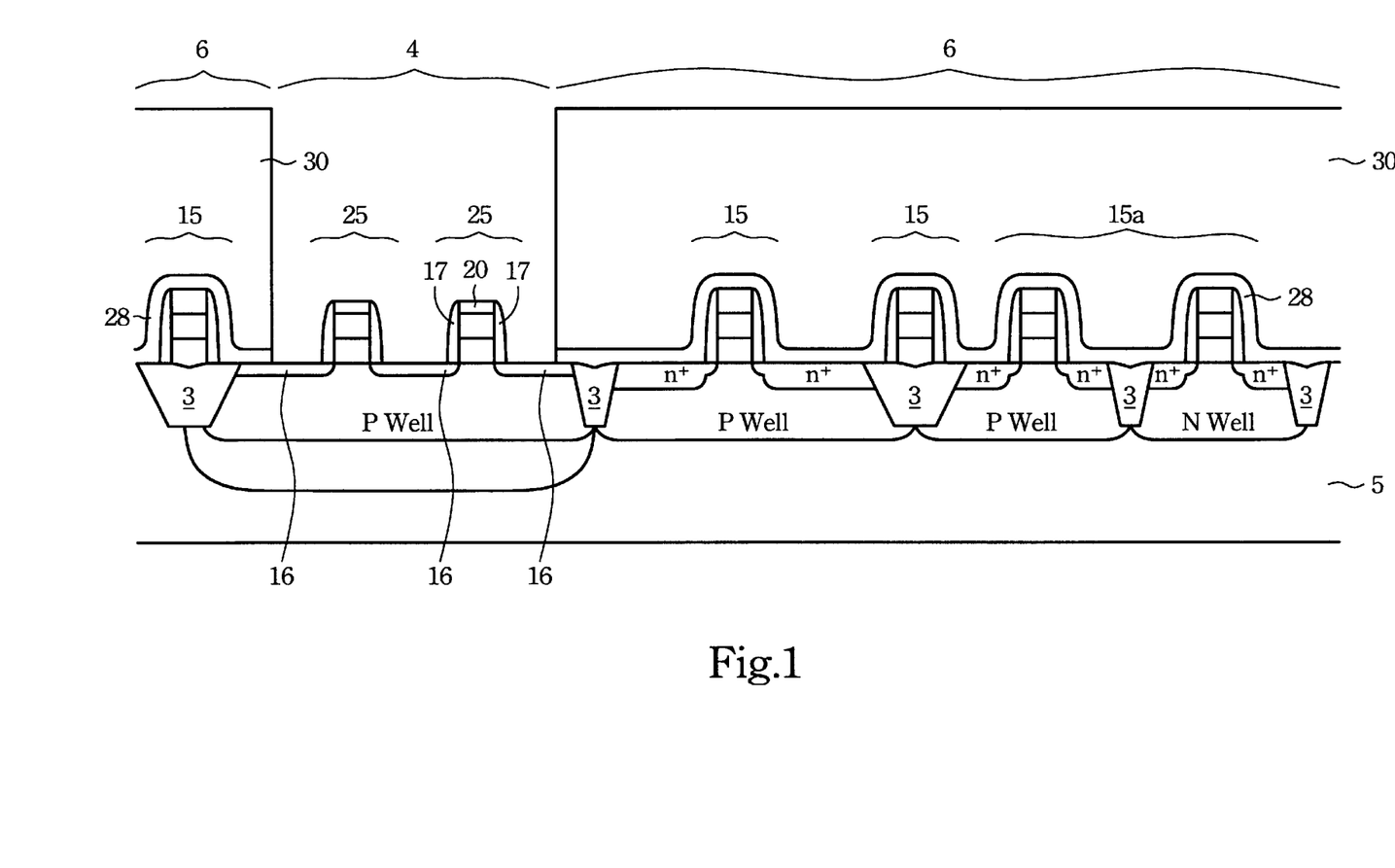
FIG. 1 is a cross-sectional view of performing an oxide layer removal in DRAM region in accordance with the prior art.

FIGS. 1–5 show processes for formation the landing pads according to the prior art. Referring to FIG. 1, the cross-sectional view shows a DRAM region 4 prepared for forming DRAM cells and a periphery transistors region 6 formed on a silicon substrate 2. In the DRAM region, there are two stack gates 25 with silicon nitride cap 20 and nitride spacers 17 for forming landing pads of DRAM cells. The periphery transistors region 6 includes a CMOS transistor 15A and NMOS transistors 15. The periphery transistors 15, 15A and two stack gates 25 are overlay with a LPTEOS layer (low-pressure tetraethyl orthosillicate) 28 having a thickness of about 45–55 nm. Thus, for forming the landing pads, the LPTEOS layer 28 is necessary to remove. FIG. 1 shows a result of the LPTEOS layer 28 removal in DRAM region 4 after etching using the photoresist layer 30 as a mask.

Figure 2:
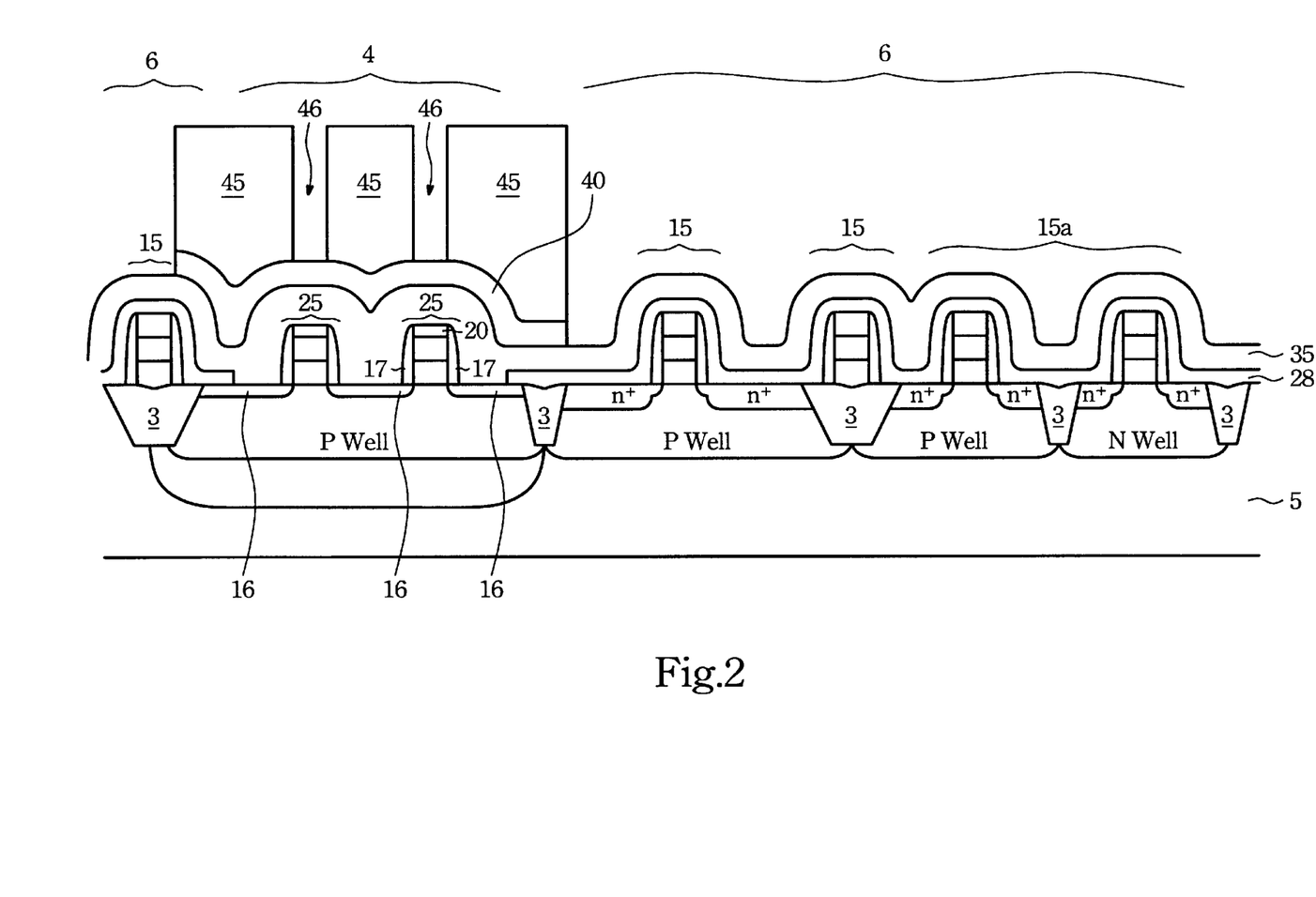
FIG. 2 is a cross-sectional view of forming a photoresist layer on TEOS capping layer/polysilicon layer to defined photoresist openings in accordance with the prior art.

Please see FIG. 2, after the photoresist layer 30 is stripped, a doped polysilicon layer 38 is formed on all resulting surface to a thickness of about 150 nm by an in-situ doped LPCVD process. A TEOS capping layer 40 is then formed successively on the doped polysilicon layer 38 to about 90–110 nm in thickness. After that, a photoresist pattern 45 is masked on the DRAM region 4 so as to form photoresist openings 46 over each the silicon nitride cap 20. The size of opening is about 0.3 μm.

Figure 3:
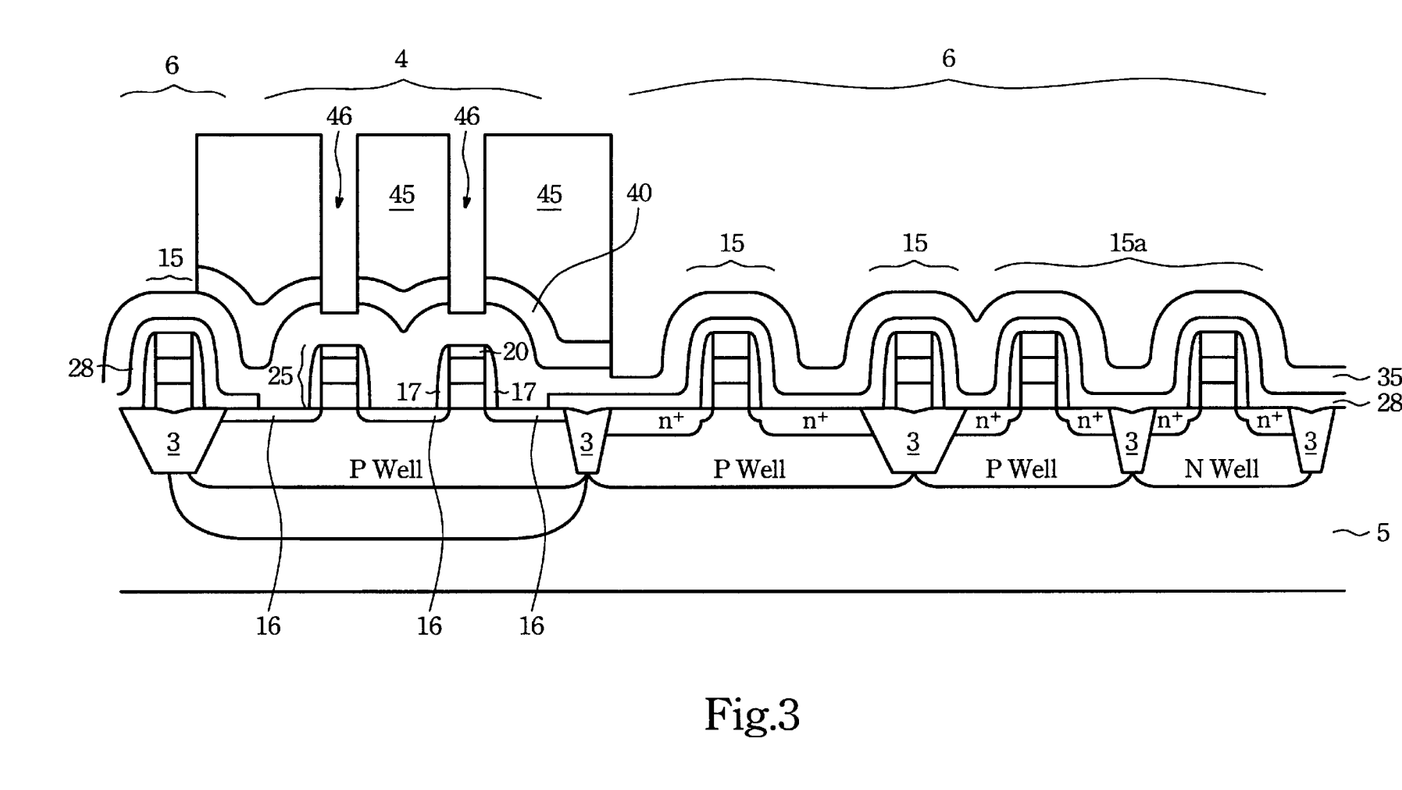
FIG. 3 is a cross-sectional view of performing TEOS etching in accordance with the prior art.

Referring to FIG. 3, a TEOS etch is performed to etch unmask regions, including photoresist openings 46 and the periphery transistor region 6.

Figure 4:
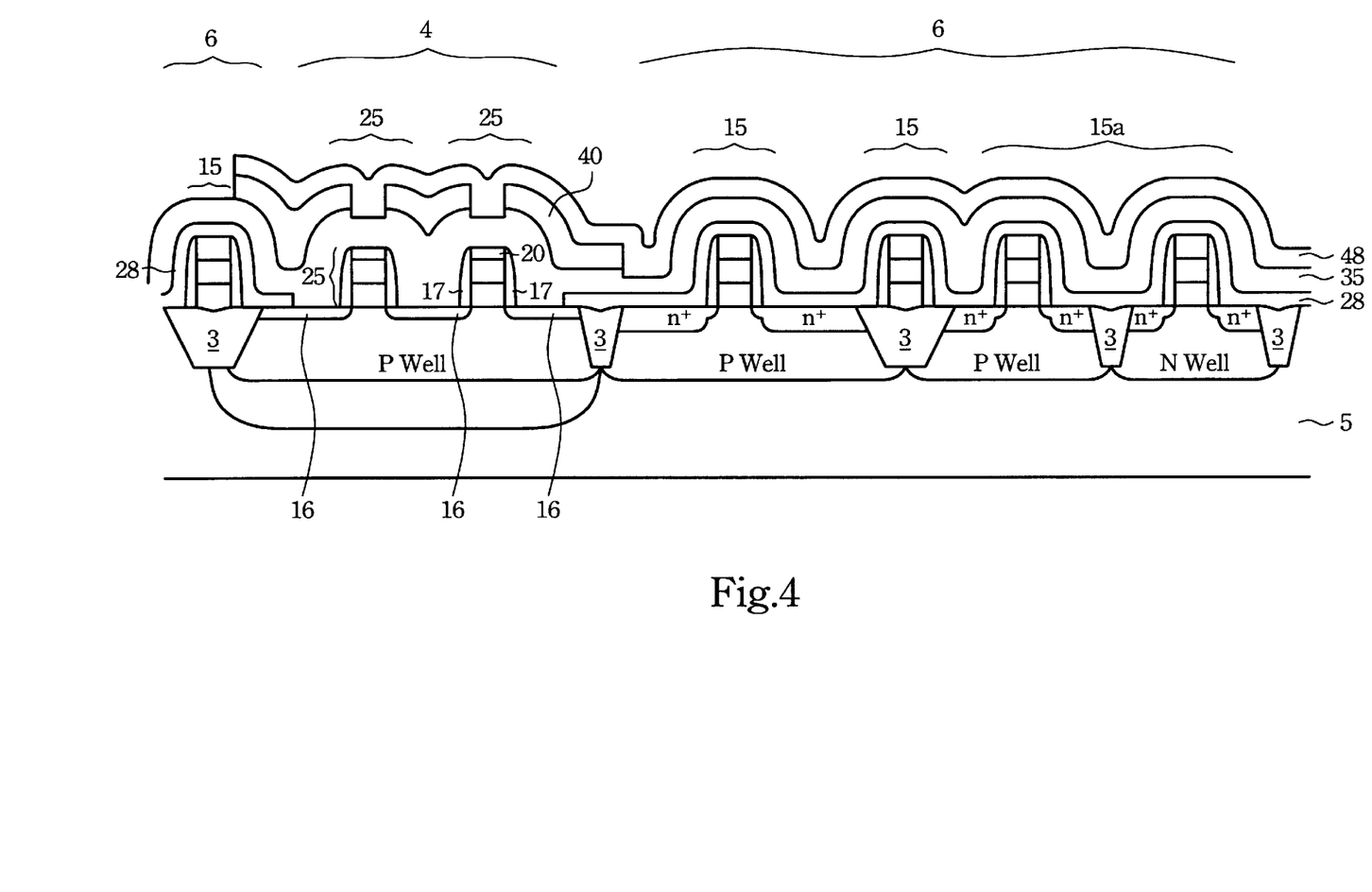
FIG. 4 is a cross-sectional view of forming a thin oxide layer on the resulting surfaces in accordance with the prior art.

Turning to FIG. 4, a thin oxide layer 47 is formed on the resulting surfaces. The LPTEOS oxide layer 48 to a thickness of about 100 nm is generally preferred.

Figure 5:
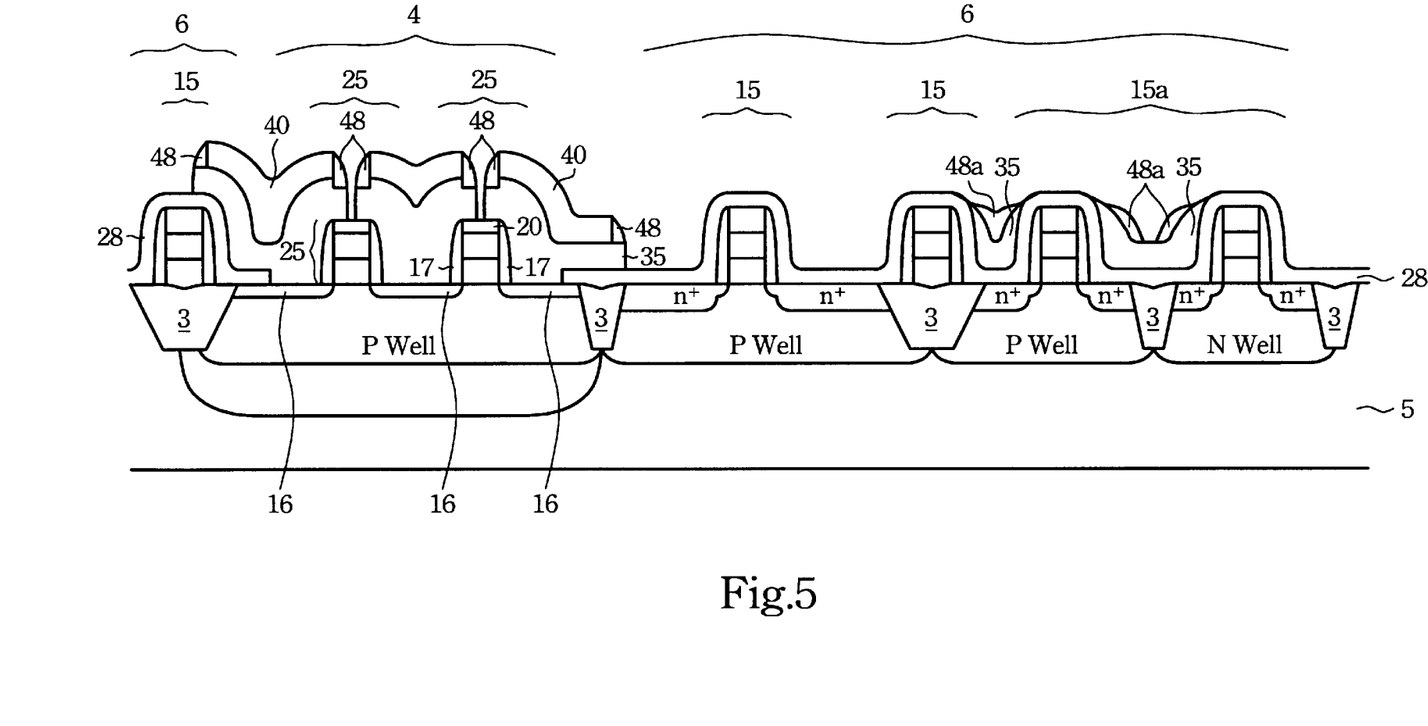
FIG. 5 is a cross-sectional view of performing an anisotropic etching through the oxide spacer and polysilicon and stopped at silicon nitride cap in accordance with the prior art.

As shown in FIG. 5, an anisotropic etching is subsequently performed to form the oxide spacers 48 on the sidewalls of the photoresist layer 45. After that, using the spacers 48 as a mask and using the silicon nitride cap 20 as a stopping layer to etch the polysilicon layer 35 is done so that the landing pads are generated.

However, some of the oxide spacer residues 48a are formed on the sidewalls of the periphery transistors 15 and 15a, resulting in circuit short as long as the adjoining transistors are close enough. The oxide spacers 48a may cause the polysilicon layer 35 residues, which is beneath the oxide layer, left on the sidewall.

In addition, the forgoing prior is a complex method too because two oxide film deposition and twice oxide etch are required, and thus increases the cost.

Consequently, the aforementioned problems need a method to improve.

SUMMARY OF THE INVENTION

An object of the invention provides a method for fabricating landing pads for DRAM cells.

The other object of the invention is to provide a lithographic method, which break through the maximum limitation that 248 nm deep ultra-violet light could approached.

The method comprises following steps: at first, a substrate formed with isolation regions, periphery transistor region and a defined DRAM region are patterned so that an oxide layer, e.g. LPTEOS, on the defined DRAM region are removed to expose the source/drain region, nitride caps, and nitride spacers. After a polysilicon layer is formed on all resulting surfaces, a photoresist pattern is subsequently formed on the polysilicon layer of the DRAM region so that a plurality of photoresist openings are, respectively, formed over each of the nitride caps. The photoresist opening is about 0.3 μm in width or beyond according the process requirement or lithography limit. Next, a conformal polymer layer of about 0.1 μm in thickness is formed on all resulting surfaces so that a smaller polymer opening of about 0.1 μm size or beyond is formed in each of the photoresist openings. Finally, using the polymer layer as a mask and using the nitride caps as stopping layers, a polymer etching and a polysilicon etching are performed to generate the landing pads.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENTS

As forgoing depicted in the background of invention, forming the landing pads with a spacing size as small as 0.1 μm is either suffering a lithography limitation or suffering complex process difficulties. The former issue is due to the 248 nm DUV stepper scanner limitation and the latter is because the oxide spacer formed within the oxide openings may cause the etching residues formed at the spacers of the periphery transistors resulting the short circuit. The present invention provides a method to resolve above issues.

Figure 6:
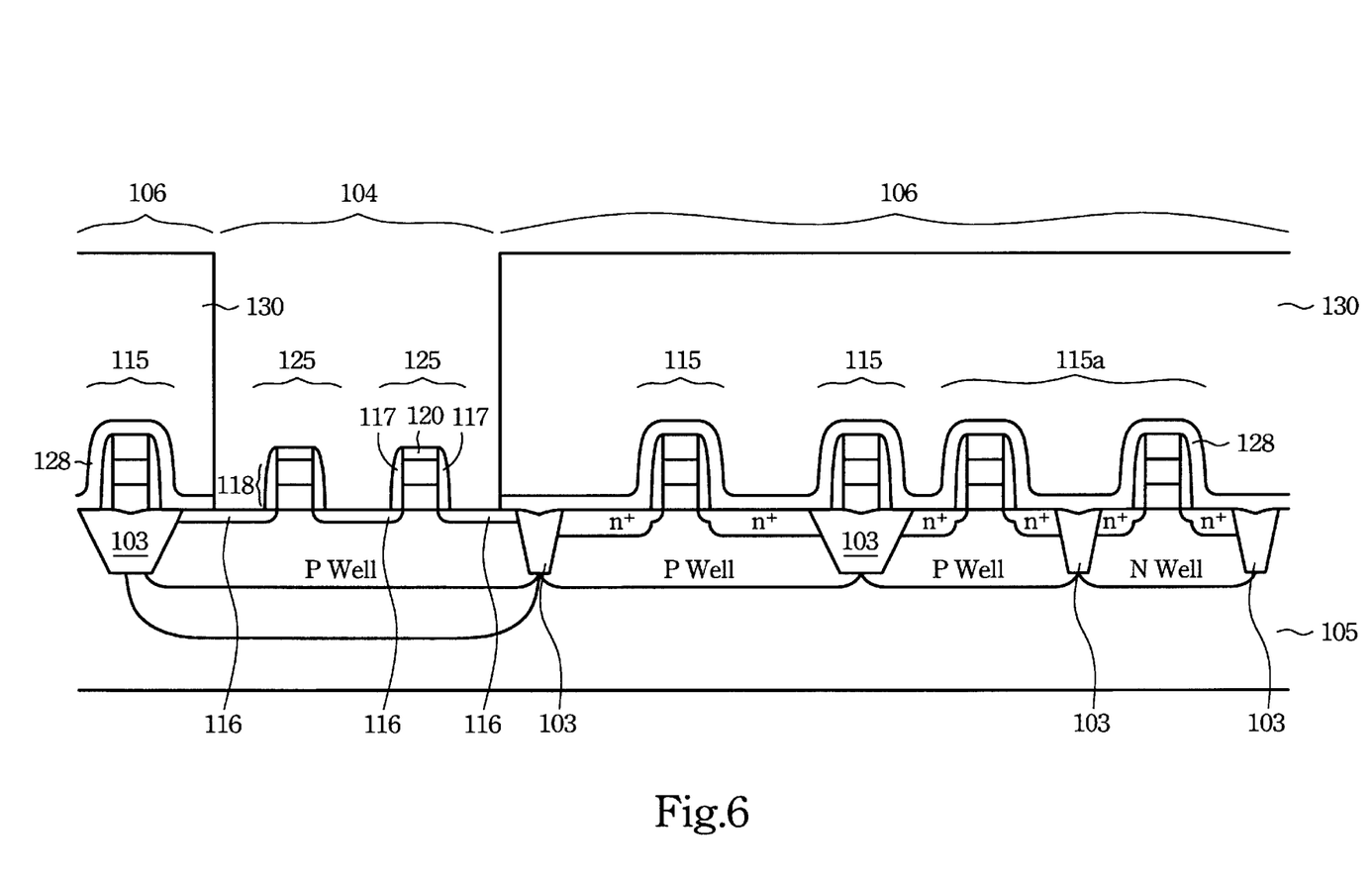
FIG. 6 is a cross-sectional view of performing an oxide layer removal in DRAM region in accordance with the present invention.

Referring to FIG. 6, a semiconductor substrate 102 is provided with isolation regions 103 separating periphery transistor region 106 from a defined region 104, where the defined region 104 is prepared for fabricating the DRAM cells, and thus herein and after called defined DRAM region 104. The isolation region 103 can be either formed as a trench isolation or a FOX isolation in accordance with the process requirement. The defined DRAM region 104 consists of stack gates 125 and sources/drain regions 116. Each of the stack gates 125 is a layered structure consists sequentially from a bottom thereof a poly-gate 118 and a silicon nitride cap 120, as well as nitride spacers 117 on sidewalls of the stack gate 125. The stack gate 125 is to serve as a word line of the DRAM cell. The periphery transistor region 106 shown in the figure includes a CMOS transistor 115A and NMOS transistors 115. The periphery transistor region 106, the defined DRAM region 104, and the isolation regions 103 are overlay with a LPTEOS or a HDP (high-density plasma) oxide layer 128. Thus, for forming the landing pads, the LPTEOS layer 128 on the defined DRAM region 104 is patterned so as to expose the source/drain regions 116, nitride spacers 117, and silicon nitride caps 120. The patterning steps comprise the step of forming a photoresist layer 130 on the periphery transistor region 106 and the isolation regions 103, step of etching away the unmask LPTEOS layer 128 and step of stripping the photoresist layer away.

Figure 7:
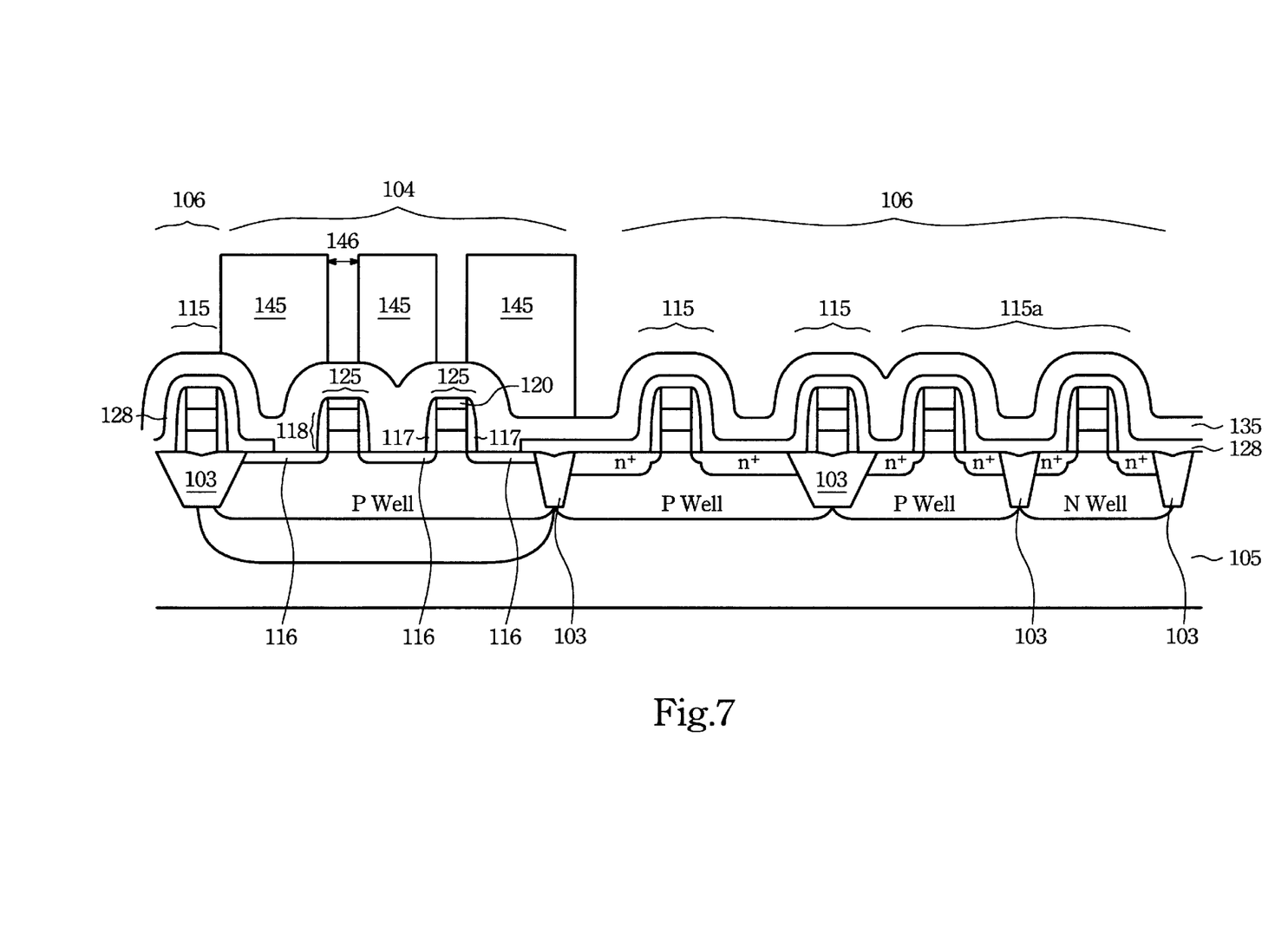
FIG. 7 is a cross-sectional view, after a photoresist pattern formed on the conductive layer is achieved in accordance with the present invention.

Referring to FIG. 7, a conductive layer 135 of about 0.1–0.2 μm in thickness is formed on all resulting surfaces. The conductive layer can be a silicide, a metal or a doped polysilicon layer. Preferably, the conductive layer 135 is formed of a doped polysilicon layer by an in-situ doped LPCVD with conductive impurities. After that, a photoresist pattern 145 containing a plurality of photoresist openings 146 is formed on the DRAM region 104. Each of the photoresist openings 148 is aligned so that each photoresist openings 146 lies over the silicon nitride cap 120. The size of photoresist opening 146 depends on the process requested or the lithographic limitation. For example, for fabricating the 64M DRAM 248 nm deep ultra-violet scanner or scanner is used to expose the photoresist. In a preferred embodiment, the photoresist opening 146 is about 0.25–0.35 μm in width.

Figure 8:
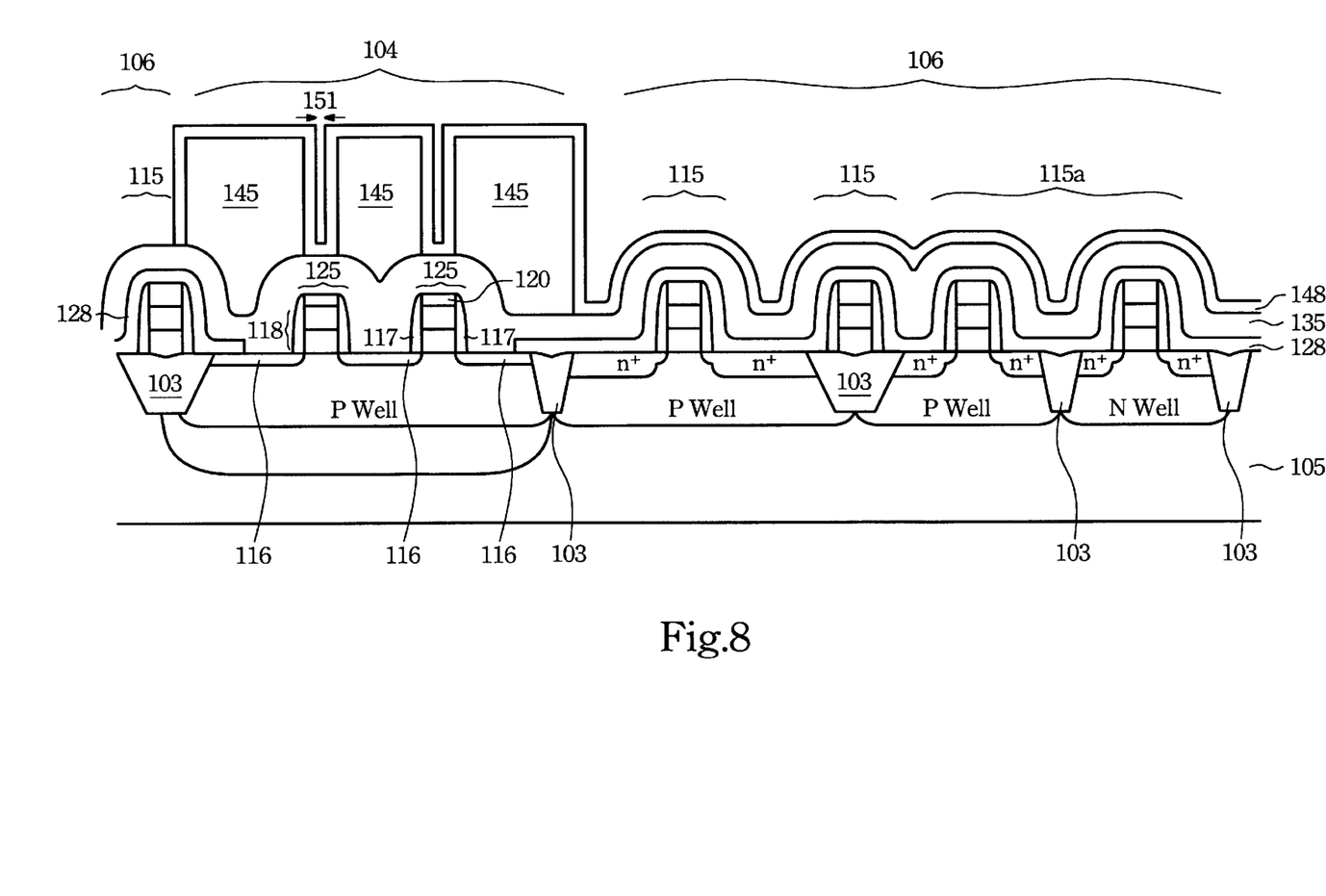
FIG. 8 is a cross-sectional view, after a conformal polymer formed in the photoresist openings and periphery transistor region is performed in accordance with the present invention.

Turning to FIG. 8, a thin polymer layer 148 is formed on all resulting surfaces, including a conformal polymer layer on the sidewall of the photoresist openings 148. Thus each of the photoresist opening 146 is shrunk (see the numeral 151) to a size of about 0.05–0.15 μm or beyond. Preferably, the thin polymer layer 148 is formed in a plasma reactor chamber (not shown) using a polymer deposition recipe rather than an etching recipe. The recipe includes a first gas mixture flowing of $CH_2F_2$, gas of about 1–100 sccm and a carrier gas, He of about 1–100 sccm to generate the plasma by a source power of about 100–1900 watt. And then a bias power of about 0–0.500 watt is utilized to deposit the polymer 148 on the resulting substrate 102. The pressure of the plasma reactor is controlled so that the pressure is within about 1–100 m-torr. Furthermore, a high polymerization gas, e.g. $CH_3F$, can substitute the $CH_2F_2$ gas as well. The $CHF_3$ gas can be used too if the bias power is adjusted to a lower value.

After that, an anisotropic polymer etching process is successively performed in the plasma reactor. The resultant cross-sectional view is shown in the FIG. 9. The polymer etching recipe comprises a source power of about 100–350 watt, a bias power of about 1–250 watt. The pressure of the plasma reactor is keep to about 1–60 m-torr. The etching gas mixture includes flowing of HBr gas of about 1–190 sccm, $O_2$ of about 1–80 sccm, and He of about 1–100 sccm. The polymer spacers 148 are shown in the figure. Little or even no any polymer residue is left on the periphery transistor region 106.

Figure 9:
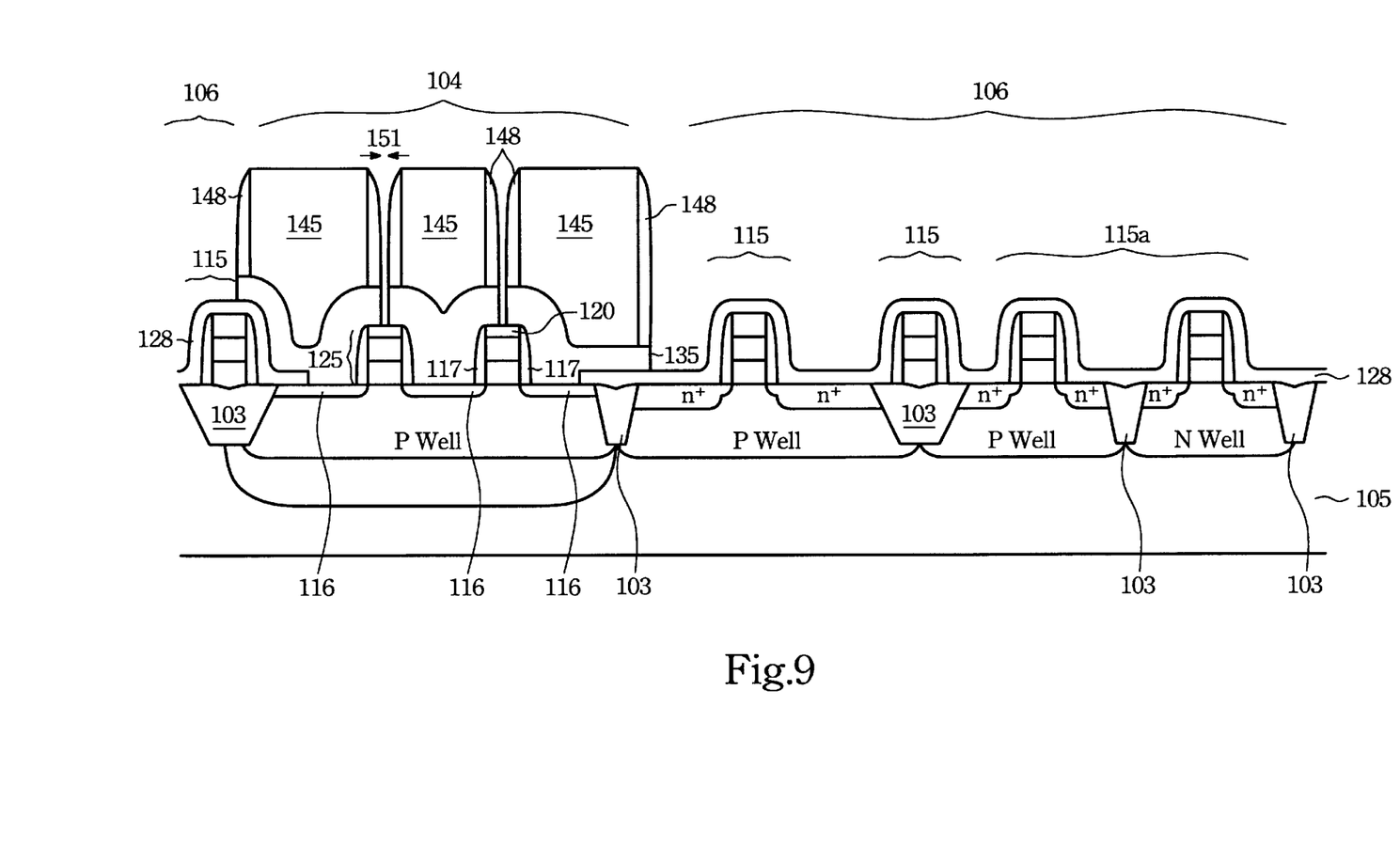
FIG. 9 is a cross-sectional view, after an anisotropic etch to form the polymer spacer, another anisotropic is subsequently performed to isolate each of the landing pads in accordance with the present invention.
Figure 10A:
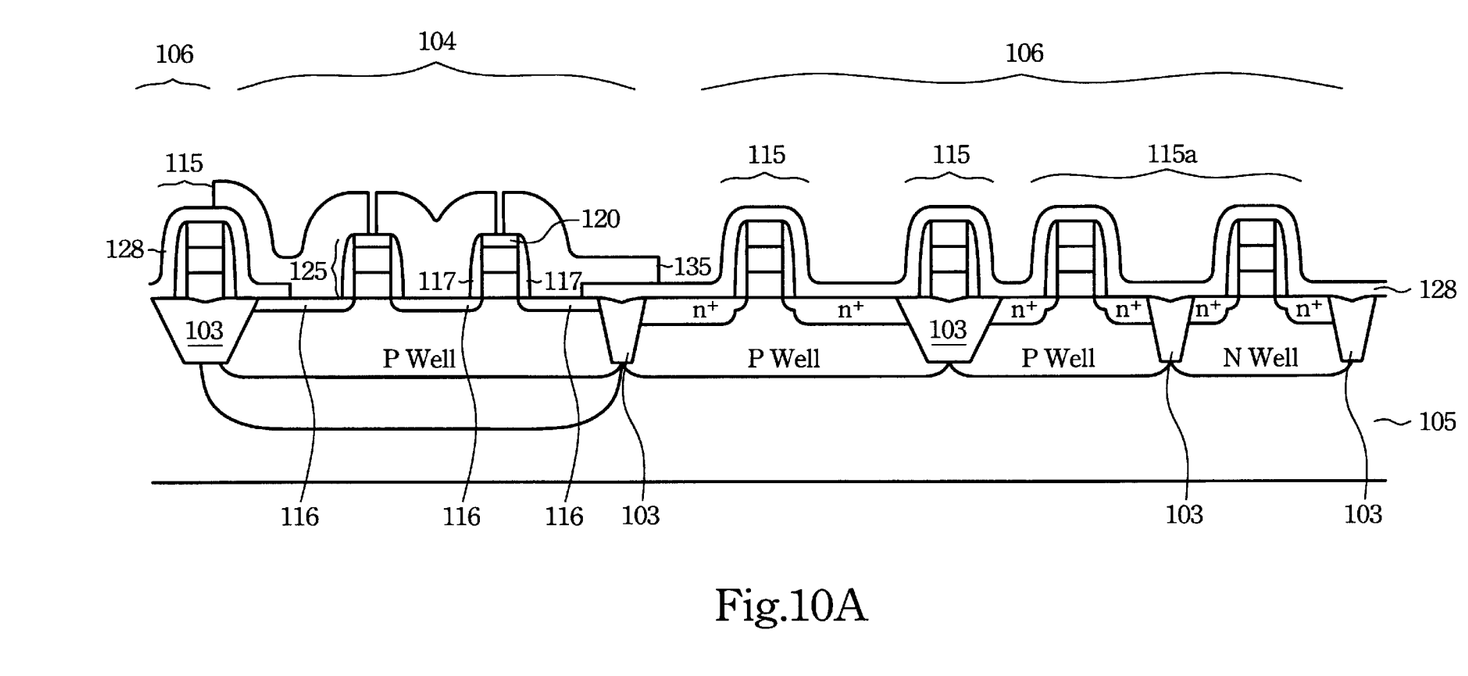
FIG. 10A is a cross-sectional view, after the polymer spacer and the photoresist are removed in accordance with the present invention.
Figure 10B:
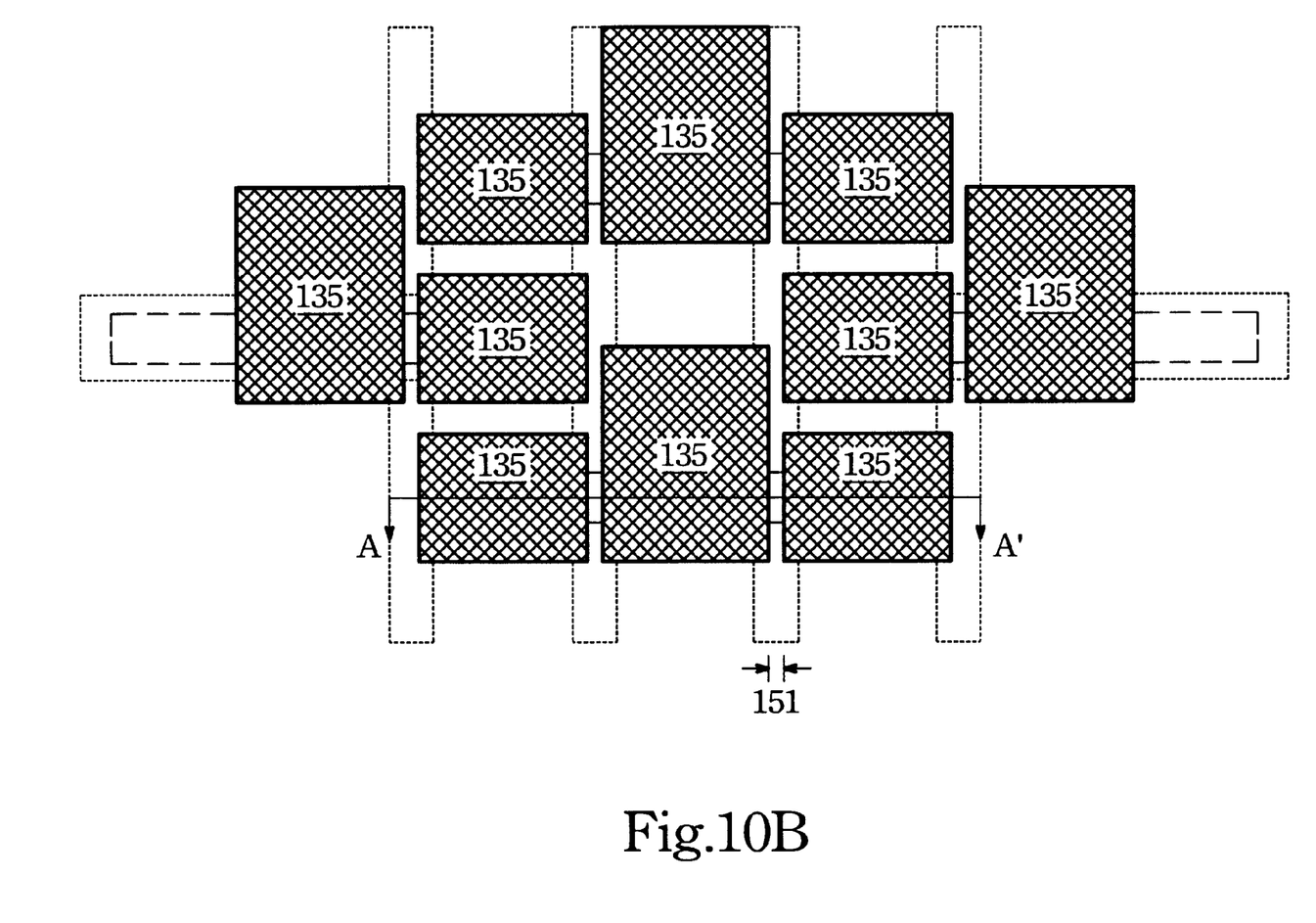
FIG. 10B is a top view, a synoptic layout the landing pads in accordance with the present invention.

Still referring to FIG. 9, another anisotropic polysilicon etching is conducted to pattern the conductive layer 135 using the polymer spacers 148 as mask and the silicon nitride cap 122 as a stopping layer. Preferably, a polysilicon etching recipe comprises a source power of about 200–350 watt, a bias power of about 50–200 watt, and a pressure of said plasma reactor of about 4–70 m-torr is used. The etching gas mixture includes flowing of $Cl_2$ of about 10–90 sccm, He of about 4–70 sccm and HBr 20–150 sccm. After that the conductive layer 135 are separated into a plurality of landing pads on the defined DRAM region 104. Finally, the polymer spacers 148 and photoresist 145 are removed, the result are shown in FIG. 10A, a cross-sectional view and FIG. 10B, a top view of synoptic layout of landing pads 135.

The invention provides a method to fabricate landing pads for DRAM cells and has following benefits:

(1) The processes used in the present invention are simplified, two oxide film deposition and twice oxide etch are reduced, and thus the cost decreases (2) 0.1 μm critical dimension or beyond is broken through by the present invention.

(3) In-situ polymer deposition, polymer etch and polysilicon etch are implemented in same plasma reactor, and thus simplifies the process.

As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

What is claimed is:

1. A method for fabricating landing pads for DRAM cells, said method comprising the steps of:

provising a semiconductor substrate, which are formed thereon with isolation regions separating periphery transistor region from a defined DRAM region, said defined DRAM region consisting of stack gates and sources/drain regions, said periphery transistor region, said isolation regions, and said DRAM region being overlay with a dielectric layer;

patterning said first dielectric layer so that said defined DRAM region are exposed with said sources/drain regions, nitride caps of said stack gates and nitride spacers of said stack gates;

forming a conductive layer on all resulting surfaces of said defined DRAM region, said isolation regions and said periphery transistor region;

forming a photoresist pattern on said conductive layer of said defined DRAM region to define a plurality of photoresist openings over said each of nitride cap of said stack gates;

forming a polymer layer on said photoresist pattern and said conductive layer of said periphery transistor region, said polymer layer being conformally formed on said photoresist openings so as to form a smaller polymer opening within each of said photoresist openings;

performing an anisotropic polymer etching so that polymer spacers are formed in each of said photoresist opening and a portion of said polymer layer on said conductive layer of said periphery transistor region are removed;

performing an anisotropic conductive layer etching using said polymer spacers as a mask and using said capping layer as a stopping layer so that said conductive layer are separated into a plurality of landing pads on said defined DRAM region.

2. The method of claim 1, wherein said dielectric layer is formed of a material selected from the group consisting of LPTEOS, HDP oxide and silicon oxide.

3. The method of claim 1, wherein said step of forming said polymer layer comprises the steps of:

placing a substrate into a plasma reactor using a polymer forming recipe, said substrate is a resultant substrate after said step of forming said photoresist pattern;

performing a polymer deposition using a polymer forming recipe so as to form said polymer layer to about 0.0.05–0.15 µm in thickness.

4. The method of claim 3, wherein said polymer forming recipe includes a source power of about 100–1900 watt, a bias power of about 0–0.500 watt, a pressure of about 1–100 m-torr in said plasma reactor, and a first gas mixture flowing of $C_xH_yF_z$ gas of about 1–100 sccm and He of about 1–100 sccm, said $C_xH_yF_z$ being a gas selected from $CHF_3$ and $CH_3F$.

5. The method of claim 1, wherein said step of performing said anisotropic polymer etching comprises the steps of:

using an polymer etching recipe in said plasma reactor; and performing an etch step using a polymer etching recipe.

6. The method of claim 5, wherein said polymer etching recipe comprises a source power of about 100–350 watt, a bias power of about 1–250 watt, a pressure of about 1–60 m-torr in said plasma reactor, and a second gas mixture flowing of HBr gas of about 1–190 sccm, $O_2$ of about 1–80 sccm, and He of about 1–100 sccm.

7. The method of claim 1, wherein said conductive layer is a polysilicon layer, and thus said step of performing an anisotropic conductive layer etching is achieved by using a polysilicon etching recipe.

8. The method of claim 6, wherein said polysilicon etching recipe comprises a source power of about 200–350 watt, a bias power of about 50–200 watt, a pressure of about 4–70 m-torr in said plasma reactor and an gas mixture flowing of $Cl_2$ of about 10–90 sccm, HBr 20–150 sccm.

9. The method of claim 1, wherein said photoresist opening is about 0.25–0.35 µm in width.

10. The method of claim 1, wherein said capping layer is a material formed of silicon nitride.

11. A method for fabricating landing pads for DRAM cells, said method comprising the steps of:

providing a semiconductor substrate, which are formed thereon with isolation regions separating a periphery transistor region from a defined DRAM region, said defined DRAM region consisting of stack gates and sources/drain regions, said periphery transistors, said isolation regions, and said sources/drain regions, and said stack gate being overlay with a dielectric layer, each of said stack gates being a layered structure comprising sequentially from a bottom thereof a polygate and a silicon nitride cap as well as nitride spacers on sidewalls of each of said stack gates;

forming a first photoresist layer on said periphery transistor region, said isolation regions so that said defined DRAM region are unmasked;

removing said dielectric layer in said defined DRAM region away;

stripping said first photoresist layer away;

forming a polysilicon layer on all resulting surfaces of said DRAM region, said isolation regions, and said periphery transistor region;

forming a second photoresist pattern on said polysilicon layer of said defined DRAM region to define a plurality of photoresist openings over said silicon nitride cap of each of said stack gates;

forming a polymer layer on said second photoresist pattern and said polysilicon layer of said periphery transistor region, said polymer layer being conformally formed on said photoresist openings so as to form a smaller polymer opening within each of said photoresist openings;

performing an anisotropic polymer etching so that polymer spacers are formed on sidewalls of each of said photoresist opening and a portion of said polymer layer on said polysilicon layer of said periphery transistor region are removed;

performing an anisotropic polysilicon layer etching using said polymer spacers as a mask and using said silicon nitride cap as a stopping layer so that said polysilicon layer are separated into a plurality of landing pads on said defined DRAM region.

12. The method of claim 11, wherein said dielectric layer is formed of a material selected from the group consisting of LPTEOS, HDP oxide and silicon oxide.

13. The method of claim 11, wherein said step of forming said polymer layer comprises the steps of:

placing a substrate into a plasma reactor using a polymer forming recipe, said substrate is a resultant substrate after said step of forming a second photoresist pattern; and performing a polymer deposition so as to form said polymer layer using a polymer forming recipe.

14. The method of claim 13, wherein said polymer forming recipe includes a source power of about 100–1900 watt, a bias power of about 0–0.500 watt, a pressure of said plasma reactor of about 1–100 m-torr, and a first gas flowing of $C_xH_yF_z$ gas of about 1–100 sccm and He of about 1–100 sccm, said $C_xH_yF_z$ gas is selected from the group consisting of $CH_2F_2$, $CHF_3$, $CH_3F$ and a combination thereof.

15. The method of claim 11, wherein said step of performing said anisotropic polymer etching comprises the steps of:

using an polymer etching recipe in said plasma reactor; and performing an etch step using a polymer etching recipe.

16. The method of claim 15, wherein said polymer etching recipe comprises a source power of about 100–350 watt, a bias power of about 1–250 watt, a pressure of said plasma reactor of about 3–20 m-torr, and a second gas mixture flowing of HBr gas of about 1–190 sccm, $O_2$ of about 1–80 sccm, and He of about 1–100 sccm.

17. The method of claim 11, wherein said polysilicon etching is using a recipe comprising a source power of about 200–350 watt, a bias power of about 50–200 watt, a pressure of said plasma reactor of about 4–70 m-torr and an gas mixture flowing of $Cl_2$ of about 10–90 sccm , HBr 20–150 sccm, and He of about 4–70 sccm.

18. The method of claim 11, wherein said photoresist opening is about 0.25–0.35 µm in width.

* * * * *